(12) United States Patent  
Chung

(10) Patent No.: US 8,537,631 B2  
(45) Date of Patent: Sep. 17, 2013

(54) SEMICONDUCTOR DEVICE HAVING CONTROL BITLINE TO PREVENT FLOATING BODY EFFECT

(75) Inventor: Woo Young Chung, Yongin (KR)

(73) Assignee: Hynix Semiconductor Inc., Icheon (KR)

( * ) Notice: Subject to any disclaimer, the term of this patent is extended or adjusted under 35 U.S.C. 154(b) by 66 days.

(21) Appl. No.: 13/346,927

(22) Filed: Jan. 10, 2012

(65) Prior Publication Data

US 2012/0269019 A1    Oct. 25, 2012

(30) Foreign Application Priority Data

Apr. 19, 2011    (KR) ..................... 10-2011-0036384

(51) Int. Cl.  
*G11C 7/06* (2006.01)

(52) U.S. Cl.  
USPC ............ 365/205; 365/149; 365/202; 257/329

(58) Field of Classification Search  
None  
See application file for complete search history.

(56) References Cited

U.S. PATENT DOCUMENTS

| | | | | |
|---|---|---|---|---|
| 4,737,829 | A * | 4/1988 | Morimoto et al. | 257/302 |
| 6,226,207 | B1 * | 5/2001 | Suh | 365/190 |
| 6,621,725 | B2 * | 9/2003 | Ohsawa | 365/150 |
| 7,525,141 | B1 * | 4/2009 | Forbes | 257/296 |
| 7,548,447 | B2 * | 6/2009 | Kim et al. | 365/150 |
| 8,213,226 | B2 * | 7/2012 | Carman | 365/177 |

* cited by examiner

Primary Examiner — Tan T. Nguyen

(57) ABSTRACT

A vertical semiconductor device is provided. The semiconductor device includes a cell array including a control bit line connected to cells and electrically isolated from a bit line, and a floating body control circuit for applying a floating control voltage to the control bit line in a predetermined period.

16 Claims, 12 Drawing Sheets

SEMICONDUCTOR DEVICE HAVING CONTROL BITLINE TO PREVENT FLOATING BODY EFFECT

CROSS-REFERENCES TO RELATED APPLICATION

The present application claims priority to Korean patent application number 10-2011-0036384 filed on Apr. 19, 2011, which is incorporated by reference in its entirety.

BACKGROUND OF THE INVENTION

1. Technical Field

The inventive concept relates to a vertical semiconductor device, and more particularly, to a semiconductor device including a cell having a vertical channel structure capable of minimizing a floating body effect.

2. Related Art

With a high integration degree of semiconductor devices, dynamic random access memories (DRAMs) of below 40 nm grade have been is demanded to improve the degree of integration. However, it is very difficult to scale down below 40 nm in a planar or recess gate transistor used in $8F^2$ (F: minimum feature size) or $6F^2$ cell architecture. Accordingly, DRAMs having $4F^2$ cell architecture have been demanded to improve the degree of integration by one-and-a-half to two times at the same scaling.

To constitute $4F^2$ cell architecture, a source unit and a drain unit of a cell transistor, that is, the source unit of a capacitor formation region in which charges are stored and the drain unit from which charges are drained to a bit line, need to form in $1F^2$. Recently, a vertical cell transistor structure in which a source unit and a drain unit are formed in $1F^2$ has been studied. In the vertical cell transistor structure, a source region and a drain region of a transistor for driving a cell are formed to be vertically disposed and the transistor is driven through a channel having a vertical pillar shape. That is, the structure that a source region and a drain region are horizontally formed in $8F^2$ is replaced with the structure that a source region and a drain region are vertically formed so that an operation of a cell transistor can be implanted in $4F^2$.

In $1F^2$ cell architecture, a bit line junction region is formed in a side of a lower portion of a pillar in a one side contact (OSC) type.

Thereby, when the bit line junction region is formed with a shallow depth, a gate does not overlap with the bit line junction region and channel length and resistance are increased, so that a threshold voltage is increased and a channel current is reduced.

On the other hand, when the bit line junction region is formed with a greater depth to overlap the gate, a width of the pillar is narrower so that a floating body effect where a channel region is isolated from a substrate by the bit line junction region is caused.

SUMMARY

The inventive concept is to provide a semiconductor device with an improved structure capable of minimizing a floating body effect while forming a junction region with a relatively deep junction depth.

According to one aspect of an exemplary embodiment, a semiconductor device includes pillars vertically extended from a semiconductor substrate, a bit line coupled to a first side of a lower portion of each of the pillar, a control bit line coupled to a second side of the lower portion of each of the pillar and electrically isolated from the bit line and a gate electrode coupled to the pillars and arranged to cross the bit line and the control bit line.

The control bit line may include any one of titanium (Ti), titanium nitride (TiN), aluminum (Al), or an alloy thereof.

The control bit line may have a stacked structure of p-type polysilicon and metal.

The semiconductor device may further include a growth layer grown on each of the pillar and formed using the pillar as a seed.

According to another aspect of another exemplary embodiment, a semiconductor device includes a cell array including a plurality of cells, a bit line which is connected to the cells and is configured to data, and a control bit line which is coupled to the cells and is electrically isolated from the bit line, a sense amplifier which is coupled to the bit line and is configured to sense data stored in the cells and a floating body control circuit which is configured to apply a floating control voltage to the control bit line.

The floating body control circuit may be configured to apply the floating control voltage to the control bit line when the data is not transferred through the bit line or may continuously apply the floating control voltage to the control bit line.

The floating control voltage may be a negative voltage or a ground voltage.

The semiconductor device may further include a row decoder configured to output a select signal for selecting a cell in the cell array to be read from or written to and a column decoder configured to output a driving signal for operating the sense amplifier coupled to the cell selected by the select signal.

The cell may include a pillar vertically extended from a semiconductor substrate, a gate coupled to at least one sidewall of the pillar and a bit line junction region coupled to the bit line on a first side of a lower portion of the pillar.

According to another aspect of another exemplary embodiment, a semiconductor module includes a plurality of semiconductor devices mounted on a substrate. Each of the plurality of semiconductor devices includes a cell array including a plurality of cells, a bit line which is coupled to the cells and transfers data and a control bit line which is electrically isolated from the bit line and is coupled to the cells and a floating body control circuit which applies a floating control voltage to the control bit line in a preset constant period.

According to still another aspect of another exemplary embodiment, a semiconductor system includes a semiconductor module having a plurality of semiconductor devices mounted on a substrate and a controller which controls an operation of the semiconductor module. Each of the plurality of semiconductor devices includes a cell array including a plurality of cells, a bit line which is coupled to the cells and transfers data and a control bit line coupled to the cells and isolated from the bit line and a floating body control circuit which applies a floating control voltage to the control bit line in a preset constant period.

According to still another aspect of another exemplary embodiment, a computer system includes a semiconductor system having at least one semiconductor module and a processor which processes data stored in the semiconductor system. The semiconductor module includes semiconductor devices mounted on a substrate. Each of the semiconductor devices includes a cell array including a plurality of cells, a bit line which is coupled to the cells and transfers data and a control bit line which is electrically isolated from the bit line and is coupled to the cells and a floating body control circuit which applies a floating control voltage to the control bit line in a preset constant period.

According to still another aspect of another exemplary embodiment, a data processing system includes at least one semiconductor device mounted on a substrate. The semiconductor device includes a cell array including a plurality of cells, a bit line which is coupled to the cells and transfers data and a control bit line which is electrically isolated from the bit line and is coupled to the cells, a floating body control circuit which applies a floating control voltage to the control bit line in a preset constant period and a processor which processes data stored in the cell array and performs a predefined specific function.

According to further another aspect of another exemplary embodiment, an electronic system including at least one data processing system. The data processing system includes at least one semiconductor device mounted on a substrate. The semiconductor device includes a cell array including a plurality of cells, a bit line which is coupled to the cells and transfers data and a control bit line which is electrically isolated from the bit line and is coupled to the cells, a floating body control circuit which applies a floating control voltage to the control bit line in a preset constant period and a processor which processes data stored in the cell array and performs a predefined specific function.

These and other features, aspects, and embodiments are described below in the section entitled "DESCRIPTION OF EXEMPLARY EMBODIMENT"

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1A:
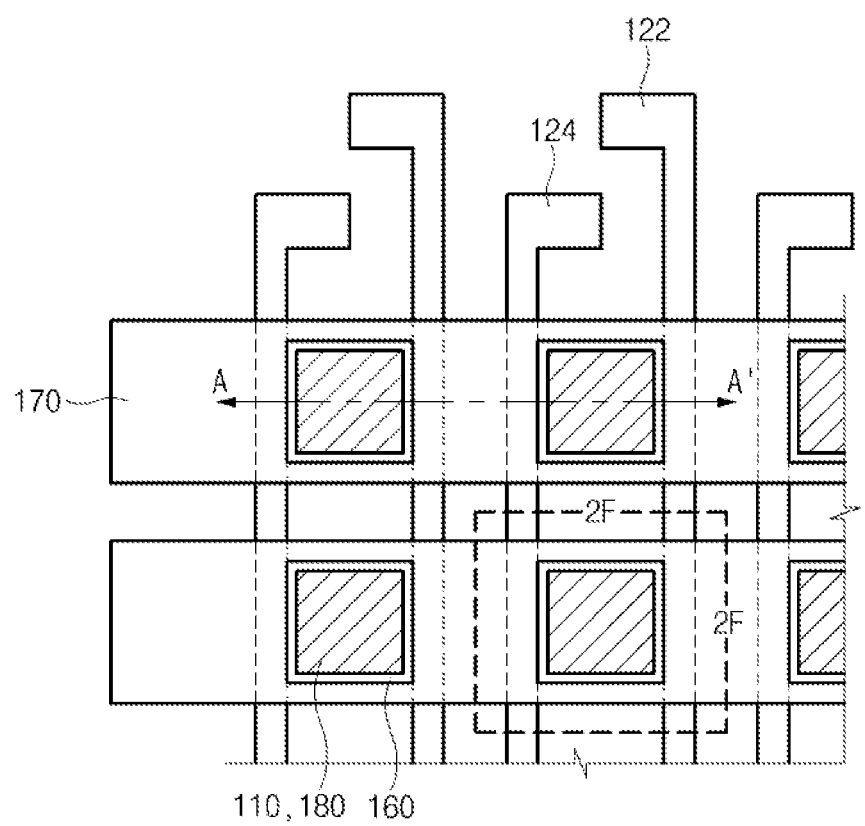
FIG. 1A is a plan view illustrating a structure of a semiconductor device according to an exemplary embodiment of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
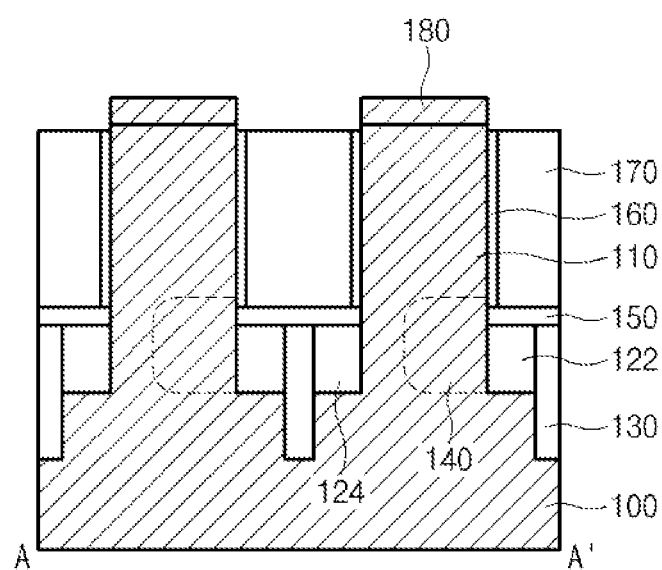
FIG. 2 is a cross-sectional view of an embodiment of a semiconductor device taken along the line A-A' of FIG. 1A.

FIG. 1A is a plan view illustrating a structure of a semiconductor device according to an exemplary embodiment of the inventive concept. FIG. 1A illustrates a structure of a semiconductor device having a $4F^2$ cell architecture. FIG. 2 is a cross-sectional view of the semiconductor device taken along the line A-A' of FIG. 1A.

Referring to FIGS. 1A and 2, a semiconductor substrate 100 is etched so that active pillars 110 which vertically protrude from the semiconductor substrate 100 are formed to have a constant height. Bit lines 122 and 124 are formed at both sides of a lower portion of each active pillar 110 in a direction perpendicular to a gate electrode 170.

The two bit lines 122 and 124 formed in parallel on both sides of each active pillar 110 have different functions. That is, one bit line 122 of the two bit lines 122 and 124, which is in contact with a bit line junction region 140, is connected between a cell and a sense amplifier, thereby serving to transfer data. On the other hand, the other bit line 124 is used to control a floating body effect in which a channel region is isolated from the semiconductor substrate 100 by a bit line junction region 140. Thus, when data is not being transferred through the bit line 122, a floating control voltage (for example, a negative bias voltage or a ground voltage) for removing holes charged in a vertical channel region is applied to the bit line 124. For example, the floating control voltage is applied to the bit line 124 to remove holes accumulated in the vertical channel region of the active pillar 110, thereby controlling the floating body effect by activating the bit line 124 every retention time period. Alternatively, the floating control voltage may be continuously applied to the bit line 124. In an embodiment, a floating body control circuit (not shown) which applies the floating control voltage to the bit line 124 may be formed in a core region or a peripheral region. For example, the floating body control circuit may be formed in a sense amplifier area, a sub word line driver area, or a sub-hole area which is a cross region of a row region and a column region.

Hereinafter, for convenience of description, the bit line 124 is referred to as a control bit line.

The bit line 122 and the control bit line 124 between adjacent active pillars 110 are device-isolated by an insulating layer 130. The bit line 122 and the control bit line 124 may be formed of the same or different materials. The bit line 122 and the control bit line 124 may each have a single layer structure formed of a conductive material or a stacked structure formed of different conductive materials.

For example, either of the bit line 122 and the control bit line 124 may be formed of metal such as titanium (Ti), titanium nitride (TiN), tungsten (W), aluminum (Al), or an alloy thereof. Alternatively, either of the bit line 122 and the control bit line 124 may have a stacked structure of polysilicon and metal. In an embodiment, the bit line 122 may have a stacked structure formed of $N^+$(As or Ph)-doped polysilicon and a metal such as Ti, TiN, W, or Al, and the control bit line 124 may have a stacked structure formed of P+(B+ or BF2)-doped polysilicon and a metal such as Ti, TiN, W, or Al.

The bit line junction region 140 may be formed as a one side contact (OSC) type by implanting impurity ions in one side of a lower portion of the pillar 110 through tilt ion implantation.

An interlayer insulating layer 150 is formed on the bit line 122 and the control bit line 124, and a gate insulating layer 160 and gate electrode 170 are formed on the interlayer insulating layer 150. The gate insulating layer 160 may include an oxide layer. The gate electrode 170 may extend to surround the pillars 110 in a direction perpendicular to the bit line 122 and the control bit line 124, thereby connecting adjacent pillars 110.

Figure 1B:
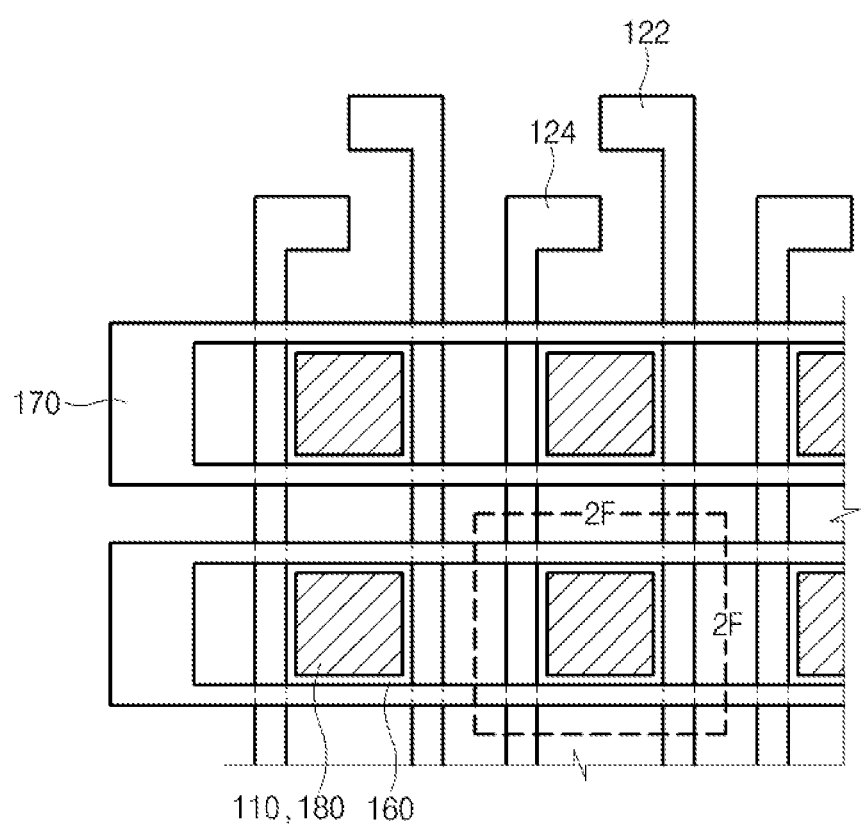
FIG. 1B is a plan view illustrating a structure of a semiconductor device according to another exemplary embodiment of the inventive concept.

In some embodiments, the gate electrode 170 is not formed to surround the pillars 110. It may be formed as any other structure to connect the pillars 110 in a direction crossing the direction of the bit lines 122 and 124. For example, as shown in FIG. 1B, the gate electrode 170 may have a structure with two lines that are formed in parallel on both sides of pillar 110, while the two lines are arranged to cross over the bit line 122 and the control bit line 124.

A junction region for connecting with a storage node (not shown) is formed on the pillar 110. At this time, the storage node junction region may be a growth layer 180 which is epitaxially grown using the pillar 110 as a seed layer.

FIGS. 3A to 3F are cross-sectional views illustrating a process of manufacturing a semiconductor device having the structure of FIG. 2.

Figure 3A:
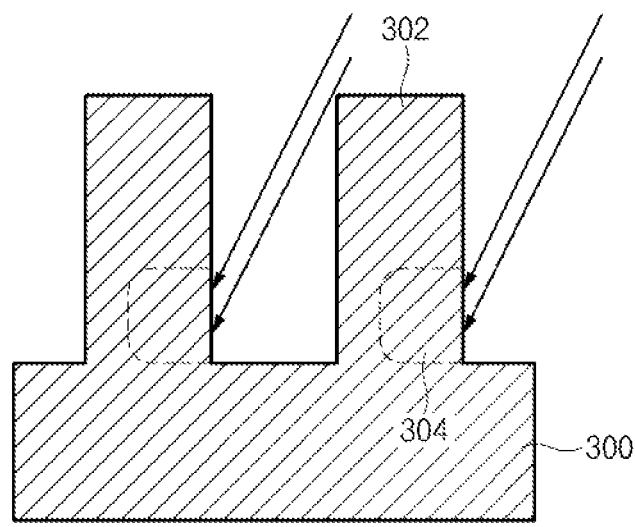
FIGS. 3A to 3F are cross-sectional views illustrating a process of manufacturing an embodiment of the semiconductor device having the structure of FIG. 2.

Referring to FIG. 3A, a hard mask pattern (not shown) for defining a region in which a bit line is to be formed is formed on a semiconductor substrate 300. The hard mask pattern may include a hard mask material layer (not shown) and an antireflection layer (not shown). The hard mask material layer may include a stacked layer of a silicon nitride layer and an amorphous carbon layer (ACL), and the antireflection layer may include a silicon oxynitride (SiON) layer.

Next, the semiconductor substrate 300 is etched to a constant depth using the hard mask pattern as an etch mask to form line type pillars 302. Subsequently, impurity ions are implanted at one side of the lower portion of the pillar 302 using a tilt ion implantation method to form a bit line junction region 304 having an OSC type. An angle for ion implantation depends on a distance between the pillars 302.

Figure 3B:
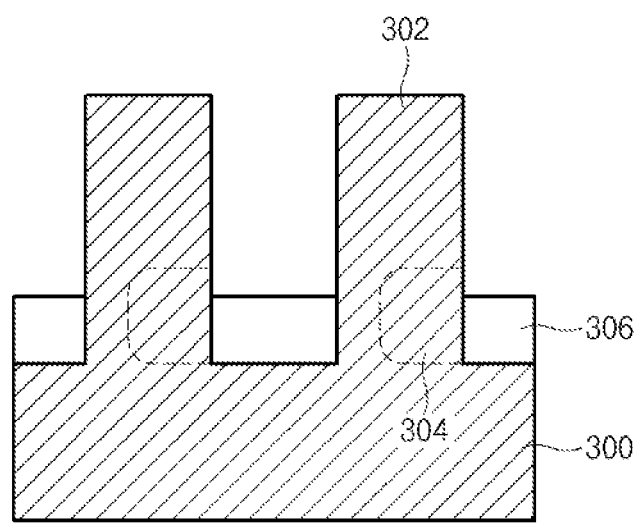

Referring to FIG. 3B, a bit line conductive layer 306 is formed to be filled between the line type pillars 302. In an embodiment, the bit line conductive layer 306 includes metal such as Ti, TiN, W, Al, or an alloy thereof. The bit line conductive layer 306 may be formed using a chemical vapor deposition (CVD) method. When the bit line conductive layer 306 is formed of W or Al, an adhesion layer (not shown) may be formed on the semiconductor substrate 300 in advance to intensify adhesion between the bit line conductive layer 306 and the semiconductor substrate 300 before the bit line conductive layer 306 is deposited. A metal nitride layer such as TiN may be used as the adhesion layer and may be thinly deposited using a CVD method.

Next, the bit line conductive layer 306 is etched so that the bit line conductive layer 306 remains at a constant height in a lower portion of a trench between the pillars 302.

Figure 3C:
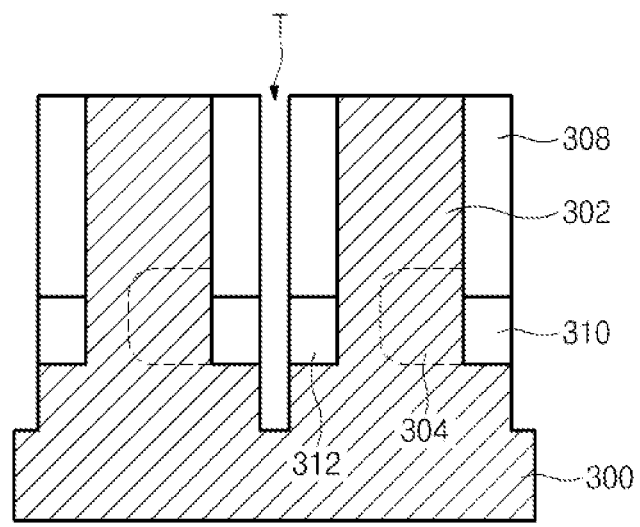

Referring to FIG. 3C, an insulating layer 308 is formed on the bit line conductive layer 306 to fill between the pillars 302, and then is etched to be planarized. A boro-phospho silicate glass (BPSG) layer may be used as the insulating layer 308.

Next, an ACL layer (not shown), an antireflection layer (not shown) and a photosensitive layer (not shown) are formed on the insulating layer 308 and the photosensitive layer is exposed and developed to form a bit line pattern (not shown). Subsequently, the antireflection layer, the ACL layer, the insulating layer 308, the bit line conductive layer 306 and the semiconductor substrate 300 formed of silicon (Si) are etched using the bit line pattern as an etch mask to form a trench T for device isolation. That is, the bit line conductive layer 306 is device-isolated into a bit line 310 and a control bit line 312 by the trench T.

The bit line 310 is formed on one side of the pillar 302 to be in contact with the bit line junction region 304, and serves as a conventional bit line for transferring data stored in a cell to a sense amplifier, or transferring data from the sense amplifier to the cell. The control bit line 312 is formed on the other side of the pillar 302 and parallel to bit line 310. A floating control voltage is applied during a time (for example, a retention time) when the bit line 310 does not transfer data, or is always applied to the control bit line 312, so that the control bit line 312 serves to remove holes accumulated in a channel region of the pillar 302 when data is stored in the cell. That is, the control bit line 312 serves to remove a floating body effect for the pillar 302.

Figure 3D:
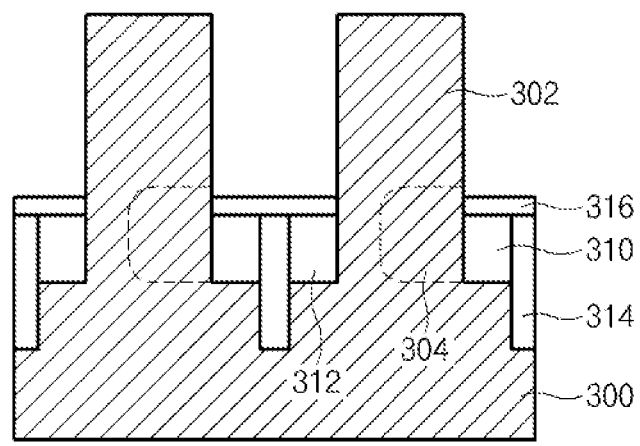

Referring to FIG. 3D, an insulating layer 314 is formed to fill trench T. Before the insulating layer 314 is deposited in trench T, a heat treatment for an exposed Si surface may be performed to form a thermal oxide layer (not shown). The thermal oxide layer may be formed by oxidizing Si at a temperature of a range of 200° C. to 1000° C. in an atmosphere including a gas such as $O_2$, $H_2O$, $H_2$ and $O_3$.

Next, the insulating layers 308 and 314 are etched until the bit line 310 and the control bit line 312 are exposed. Subsequently, an interlayer insulating layer 316 is formed on the bit line 310, the control bit line 312 and the insulating layer 314.

Figure 3E:
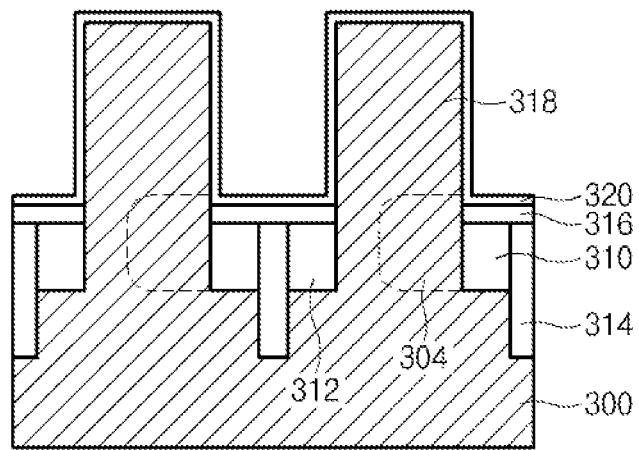

Referring to FIG. 3E, a sealing nitride layer (not shown) is formed on a resultant structure of FIG. 3D and planarized to expose the pillar 302. The sealing nitride layer and the pillar 302 are etched using a hard mask pattern (not shown) for defining a region in which a gate is to be formed until the interlayer insulating layer 316 is exposed so that the line type pillar 302 is divided into a plurality of square type pillars 318.

Next, the sealing nitride layer is removed and a gate insulating layer 320 is formed on surfaces of the pillar 318 and the interlayer insulating layer 316. The gate insulating layer 320 may include an oxide layer.

Figure 3F:
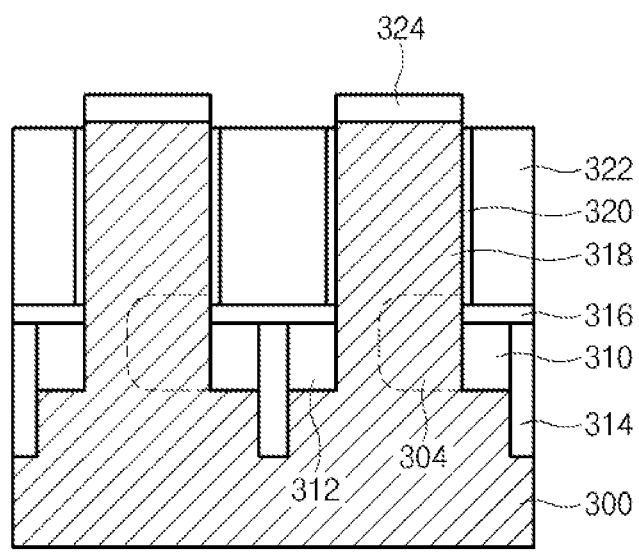

Referring to FIG. 3F, portions of the gate insulating layer 320 on upper surfaces of the pillar 318 and the interlayer insulating layer 316 are selectively removed, to form a gate insulating layer 320 surrounding a sidewall of the pillar 318.

Next, a gate conductive layer (not shown) is formed between the pillars 318 and then etched using a gate mask (not shown) until the interlayer insulating layer 316 is exposed, thereby forming gate electrode 322. That is, the gate electrode 322 is formed to extend in a direction crossing the bit lines 122 and 124 as the gate electrode 170 in FIG. 1a or 1b.

Next, a growth layer 324 is formed through an epitaxial growth process using an exposed upper surface of the pillar 318 as a seed layer. Subsequently, impurities are implanted into the growth layer 324 to form a junction region which is connected to a capacitor in a subsequent process.

Hereinafter, after an insulating layer (not shown) is formed on the gate electrode 322 and the growth layer 324, a process of forming a data storage unit connected to the junction region of the growth layer 324 and subsequent processes are performed according to conventional techniques, and thus description thereof will be omitted. The particular data storage unit used in a specific embodiment may depend on the type of semiconductor device being formed. That is, the transistor having a vertical channel structure and the bit line structure according to the above-described embodiments may be used in various semiconductor devices. For example, the structures may be applied to dynamic random Access memories (DRAMs), static RAMs (SRAMs), magnetic RAMs (MRAMs), ferroelectric RAMs (FeRAMs), phase change RAMs (PRAMs), resistance RAMs (ReRAMs), synchronous graphics RAMs (SGRAMs) or the like. When the above-described vertical channel structure is applied to a DRAM, the data storage unit may be a capacitor. When the above-described vertical channel structure is applied to a FeRAM, the data storage unit may be a capacitor in which a ferroelectric material is used as a capacitor material. When the above-described vertical channel structure is applied to an MRAM, the data storage unit may be a magnetic tunnel junction (MTJ). When the above-described vertical channel structure is applied to a PRAM or ReRAM, a phase-change material may be used as the data storage unit.

Figure 4:
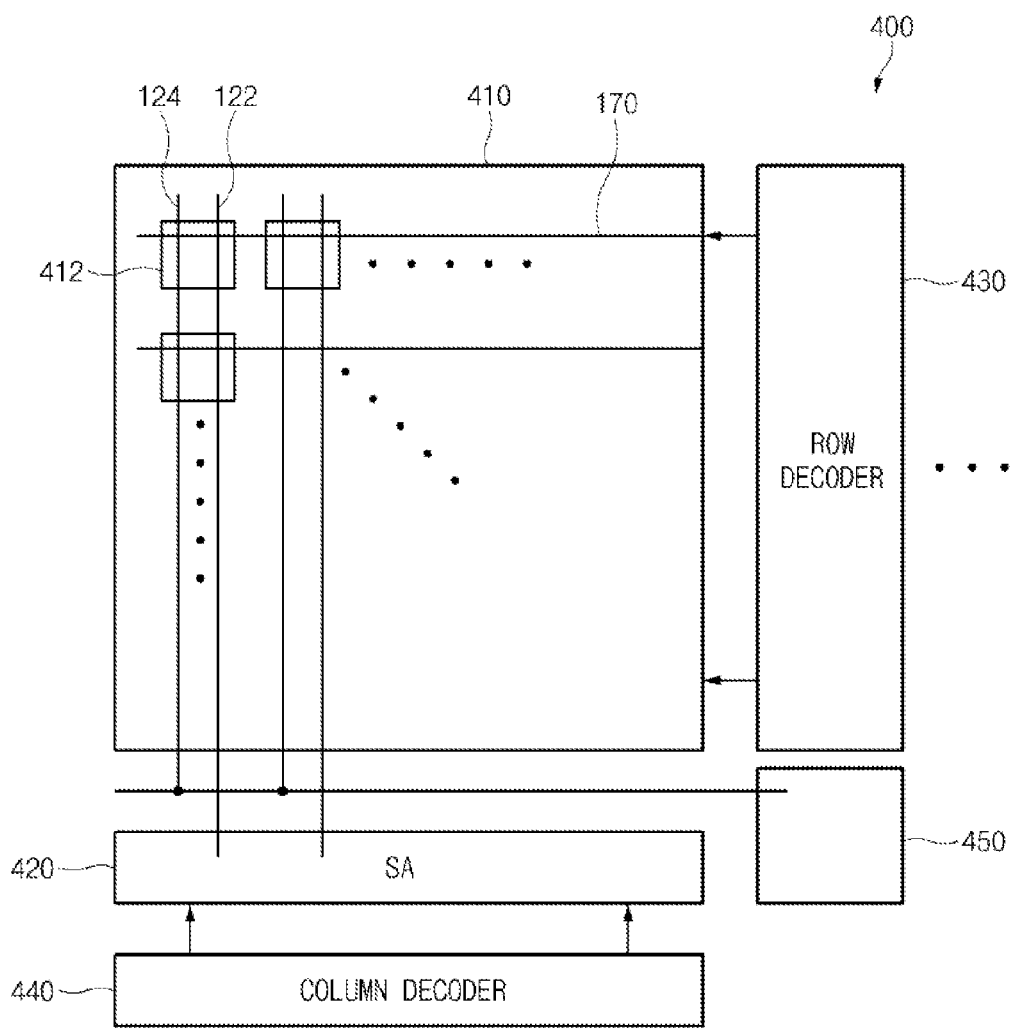
FIG. 4 is a view illustrating a semiconductor device including a core region of FIGS. 1A and 1B according to the exemplary embodiment.

FIG. 4 is a view illustrating a semiconductor device including a core region of FIG. 1A or 1B according to an exemplary embodiment. For convenience of description, the reference numbers for the bit lines 122 and 124 and a word line (the gate electrode) 170 are the same as those used in FIGS. 1A, 1B and 2.

The semiconductor device 400 includes a cell array 410, a sense amplifier 420, a row decoder 430, a column decoder 440 and a floating body control circuit 450.

The cell array includes a plurality of memory cells 412 having a vertical channel structure and arranged to be connected to word lines, bit lines, and control bit lines. For example, each of the memory cells 412 is connected to a bit line 122 for transferring data and a control bit line 124 for removing holes accumulated in a data storage process. The bit line 122 and the control bit line 124 connected to each memory cell 412 may be formed to have the same structure as illustrated in FIGS. 1A, 1B and 2.

The sense amplifier 420 is connected to the bit line 122 to sense and amplify data stored in the memory cells 412.

The row decoder 430 generates a word line selection signal for selecting a memory cell 412 to be read or written and applies the word line selection signal to the word line 170.

The column decoder 440 generates a driving signal for operating a sense amplifier 420 connected to the memory cell 412 selected by the row decoder 430 and outputs the driving signal to the sense amplifier 420.

The floating body control circuit 450 is connected to the control bit line 124 and applies a floating control voltage to the control bit line 124 continuously or during a retention time period. In an embodiment, the floating control voltage may be a negative voltage or a ground voltage. The floating body control circuit 450 may be formed in a sub-hole area of the core area. The sense amplifier 420 and decoder 430 and 440 are used in a conventional memory device and thus a detailed description of structure and operation thereof will be omitted.

The semiconductor device 400 of FIG. 4 may be applied to DRAMs, but it is not limited thereto. The semiconductor device of FIG. 4 may be applied to SRAMs, flash memories, FeRAMs, MRAMs, PRAM or the like.

The above-described semiconductor device may be applied to a computing memory used in a desktop computer, a portable computer or a server, a graphics memory having various specifications, and a personal portable computing device. Further, the semiconductor memory may be provided to a portable storage medium such as a magnetic stick, a multi-media card (MMC), a super digital (SD) card, a compact flash (CF) card, an extreme digital (xD) picture card, or an universal serial bus (USB) flash device or various digital applications such as MP3P, a portable multi-media player (PMP), a digital camera, a camcorder or a mobile phone. In addition, the semiconductor device may be applied to a technology such as a multi-chip package (MCP), a disk on chip (DOC), or an embedded device. The semiconductor device may be applied to a CMOS image sensor (CIS) to be provided to various fields such as a camera phone, a web camera, or medical endoscopy.

Figure 5:
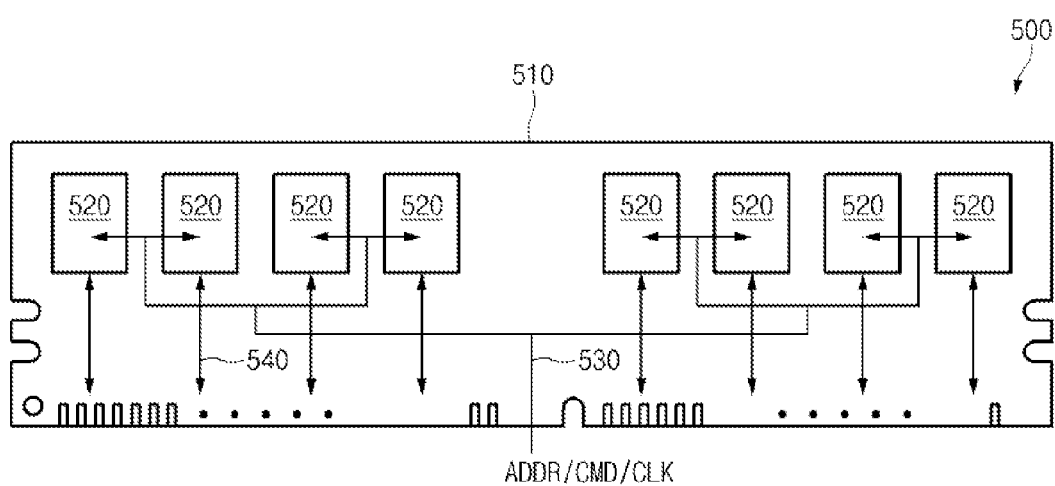
FIG. 5 is a view illustrating a configuration of a semiconductor module according to an exemplary embodiment of the inventive concept.

FIG. 5 is a view illustrating a configuration of a semiconductor module according to an exemplary embodiment of the inventive concept.

The semiconductor module 500 includes a plurality of semiconductor devices 520 mounted on a module substrate 510, a command link which allows the semiconductor devices 520 to receives a control signal (an address signal ADDR and a command signal CMD) and a clock signal (CLK) from an external controller (not shown) and a data link 540 which is connected to the semiconductor devices 520 and transfers data inputs and outputs to and from the semiconductor devices 520.

The semiconductor devices 520, for example, may include the semiconductor device as illustrated in FIG. 4. The semiconductor device 520 mounted on the module substrate 510 includes a cell array including a control bit line which is connected to the memory cell having the vertical channel structure as above illustrated and controls a floating body effect and a floating body control circuit which applies a floating control voltage to the control bit line in a constant period. The command link 530 and the data link 540 may be formed in the same manner, as or in a similar manner, to a conventional semiconductor module.

In FIG. 5, eight semiconductor devices 520 are mounted on a front surface of the module substrate 510, but eight semiconductor devices 520 may be also mounted on a rear surface of the module substrate 510 in the similar manner. That is, the semiconductor devices 520 may be mounted on one side surface or both side surfaces of the module substrate 510. The number of semiconductor devices 520 is not limited to the number of semiconductor devices described with respect to FIG. 5. Furthermore, the material and structure of the module substrate 510 are not limited to embodiments described herein.

Figure 6:
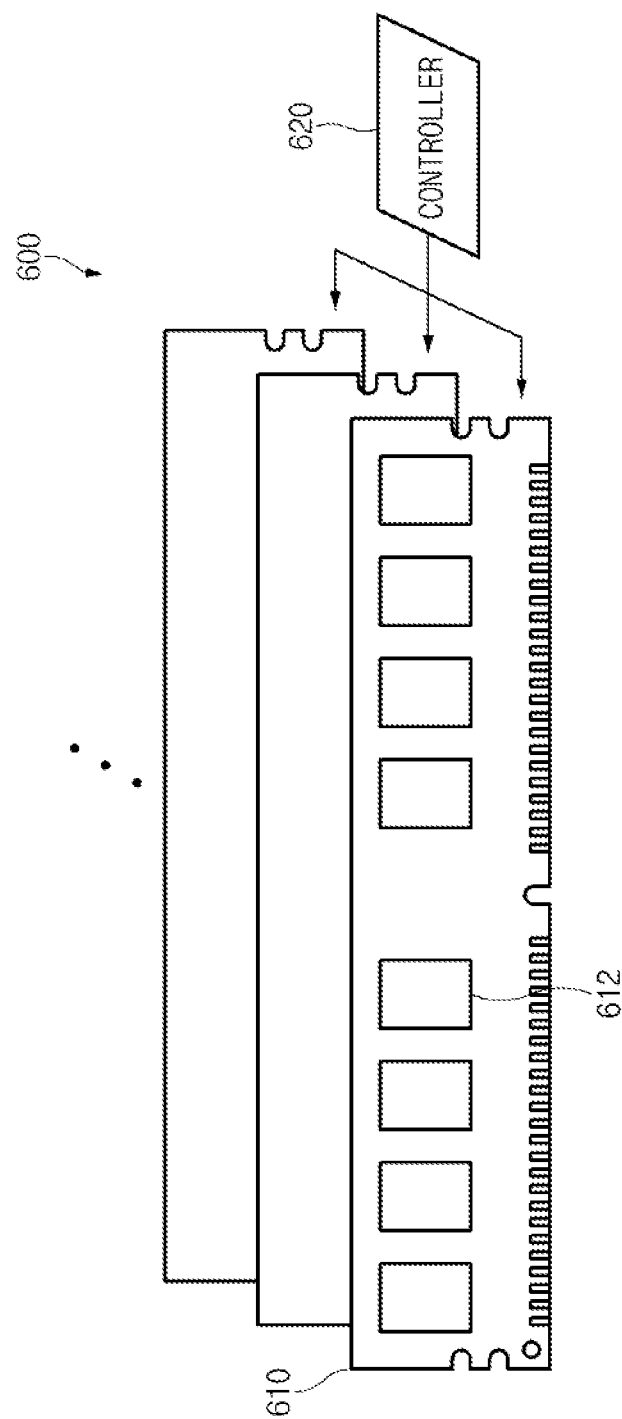
FIG. 6 is a view illustrating a configuration of a semiconductor system according to an exemplary embodiment of the inventive concept.

FIG. 6 is a view illustrating a configuration of a semiconductor system according to an exemplary embodiment of the inventive concept.

The semiconductor system 600 includes at least one semiconductor module 610 including a plurality of semiconductor devices 612, and a controller 620 which provides a bidirectional interface between the semiconductor module 610 and an external system (not shown) to control an operation of the semiconductor module 610.

The controller 620 may be formed to have the same function as or a similar function to a controller for controlling an operation of a plurality of semiconductor modules in a conventional data processing system, and thus a detailed description thereof will be omitted in the exemplary embodiment.

The semiconductor module 610 may use, for example, the semiconductor module 500 as illustrated in FIG. 5. A semiconductor device mounted on the semiconductor module 610 includes a cell array which includes a plurality of cells having the above-described vertical channel structure, a bit line which is connected to the cells and transfers data, and a control bit line which is connected to the cells and is electrically insulated from the bit line. The semiconductor device includes a floating body control circuit which applies a floating control voltage to the control bit line in a predetermined set period (for example, a retention period).

Figure 7:
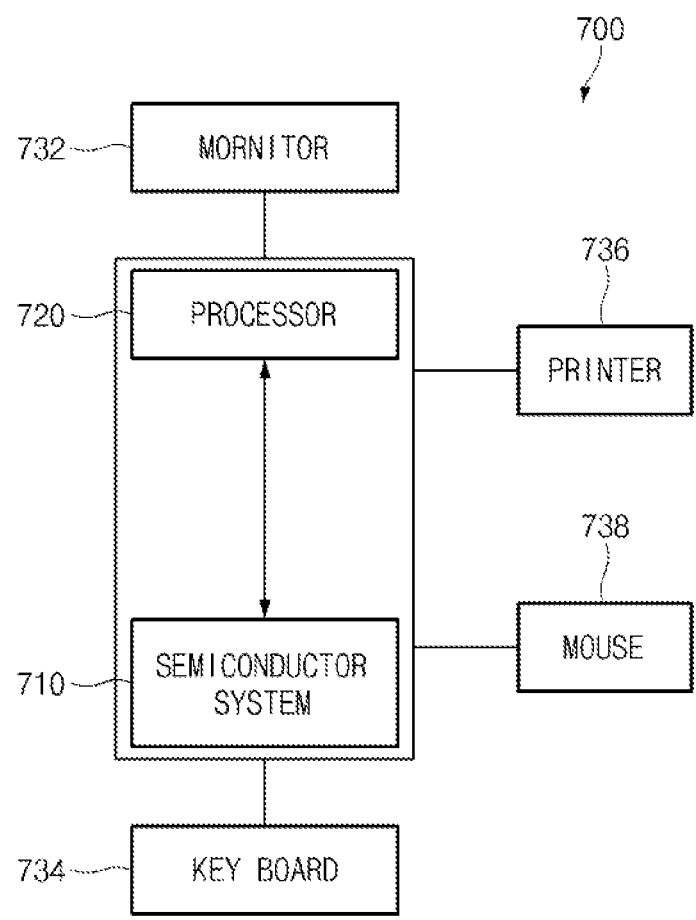
FIG. 7 is a view illustrating a structure of a computer system according to an exemplary embodiment of the inventive concept.

FIG. 7 is a view illustrating a configuration of a computer system according to an exemplary embodiment of the inventive concept.

The computer system 700 includes a semiconductor system 710 and a processor (CPU) 720.

The semiconductor system 710 stores data required to control an operation of the computer system 700. The semiconductor system 710 may use, for example, the semiconductor system 600 as illustrated in FIG. 6. The semiconductor system 710 includes at least one semiconductor module. A semiconductor device included in the semiconductor module includes a cell array including a control bit line which is connected to the cells having the above-described vertical channel structure, and controls a floating body effect. The semiconductor device included in the semiconductor module also includes a floating body control circuit which applies a floating control voltage to the control bit line in a predetermined period.

The processor 720 processes data stored in the semiconductor system 710 to control an operation of the computer system 700. The processor 720 may be formed to have the same function as or a similar function to a central processing unit (CPU) used in the conventional computer system.

The computer system 700 may include a user interface such as a monitor 732, a keyboard 734, a printer 736 or a mouse 738.

Figure 8:
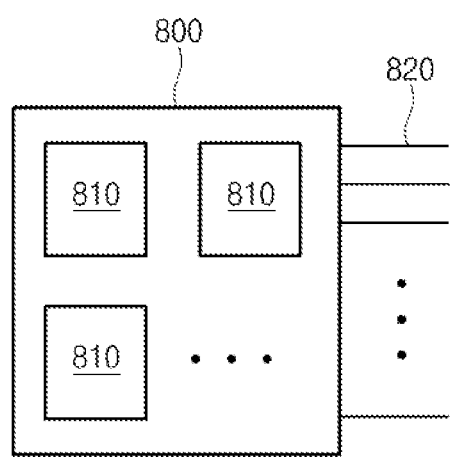
FIG. 8 is a view illustrating a configuration of a data processing system according to an exemplary embodiment of the inventive concept.

FIG. 8 is a view illustrating a configuration of a data processing system according to an exemplary embodiment of the inventive concept.

The data processing system 800 is included in an electronic system and performs a specific function of various functions of the electronic system (not shown).

The data processing system 800 includes at least one semiconductor device 810 mounted on a substrate.

The semiconductor device 810 includes a cell array (not shown) in which data required to perform a specific function of the electronic system is stored, and a processor (not shown) which processes the data stored in the cell array and controls the electronic system performing the specific function. That is, the semiconductor device 810 includes a unit for storing data in one unit element, such as a die or chip, and a unit for processing the stored data and performing specific functions of the electronic system.

The cell array includes a plurality of cells having the above-described vertical channel structure, a bit line which is connected to the cells and transfers data, and a control bit line which is connected to the cells and is electrically isolated from the bit line to control a floating body effect. The semiconductor device 810 includes a floating body control circuit which applies a floating control voltage to the control bit line in a predetermined set period (for example, a retention period).

The data processing system 800 may be connected to other elements (for example, a CPU) of the electronic system through leads 820 to unidirectionally or bidirectionally provide and receive data.

Figure 9:
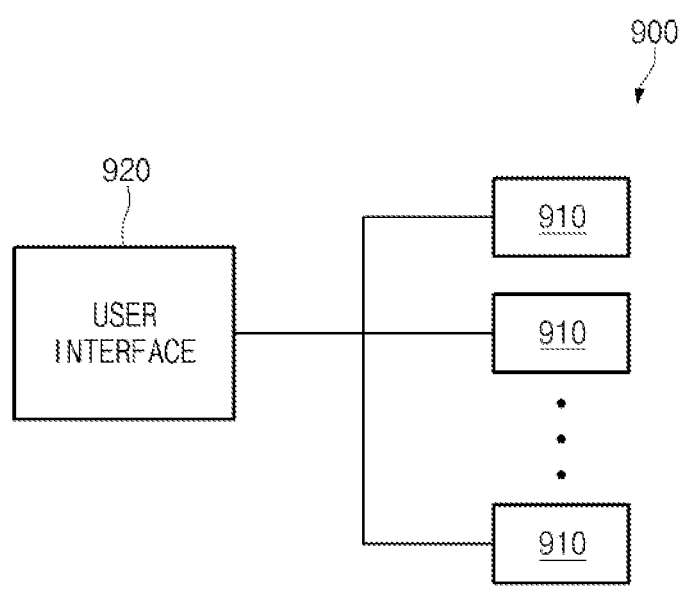
FIG. 9 is a view illustrating a configuration of an electronic device according to an exemplary embodiment.

FIG. 9 is a view illustrating a configuration of an electronic system according to an exemplary embodiment of the inventive concept.

The electronic system 900 includes at least one data processing system 910 and a user interface 920.

The data processing system 910 performs at least one of various functions of the electronic system 900, and includes at least one semiconductor device mounted on a substrate. The semiconductor device includes a cell array (not shown) in which data required to perform a specific function of the electronic system 900 is stored, and a processor (not shown) that processes the data stored in the cell array and controls a corresponding function. The cell array includes a plurality of cells having the above-described vertical channel structure, a bit line which is connected to the cells and transfers data, and a control bit line which is electrically isolated from the bit line and is connected to the cells to control a floating body effect. The semiconductor device includes a floating body control circuit which applies a floating control voltage to the control bit line in a preset constant period.

The user interface 920 provides an interface between a user and the data processing system 910. The user interface 920 may include a key pad, a touch screen and a speaker which are integrally installed in the electronic system 900.

The electronic system 900 includes an embedded system provided in various electronic information apparatuses such as a computer, a home appliance, a factory automation system, an elevator, or a mobile phone.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure, and are intended to fall within the scope of the appended claims.

What is claimed is:

1. A semiconductor device, comprising:
   a pillar vertically extended from a semiconductor substrate;
   a bit line coupled to a first side of a lower portion of the pillar;
   a control bit line coupled to a second side of the lower portion of the pillar and electrically isolated from the bit line; and
   a gate electrode coupled to the pillar and arranged to cross the bit line and the control bit line.

2. The semiconductor device of claim 1, wherein the control bit line includes any one of titanium (Ti), titanium nitride (TiN), aluminum (Al), or an alloy thereof.

3. The semiconductor device of claim 1, wherein the control bit line has a stacked structure of polysilicon and metal.

4. The semiconductor device of claim 3, wherein the polysilicon is p-type polysilicon.

5. The semiconductor device of claim 1, further comprising a growth layer grown on the pillar and formed using the pillar as a seed.

6. A semiconductor device, comprising:
   a cell array including a plurality of cells, a bit line which is coupled to the cells and is configured to transfer data, and a control bit line which is coupled to the cells and is electrically isolated from the bit line;
   a sense amplifier which is coupled to the bit line and is configured to sense data stored in the cells; and
   a floating body control circuit which is configured to apply a floating control voltage to the control bit line.

7. The semiconductor device of claim 6, wherein the floating body control circuit is configured to apply the floating control voltage to the control bit line when the data is not transferred through the bit line.

8. The semiconductor device of claim 7, wherein the floating body control circuit is configured to appy the floating control voltage to the control bit line in a retention time period.

9. The semiconductor device of claim 6, wherein the floating body control circuit continuously applies the floating control voltage to the control bit line.

10. The semiconductor device of claim 6, wherein the floating control voltage is a negative voltage or a ground voltage.

11. The semiconductor device of claim 6, further comprising:
   a row decoder configured to output a select signal for selecting a cell in the cell array to be read from or written to; and
   is a column decoder configured to output a driving signal for operating the sense amplifier coupled to the cell selected by the select signal.

12. The semiconductor device of claim 6, wherein the cell includes:
   a pillar vertically extended from a semiconductor substrate;
   a gate coupled to at least one sidewall of the pillar; and
   a bit line junction region coupled to the bit line on a first side of a lower portion of the pillar.

13. The semiconductor device of claim 12, wherein the control bit line is coupled to a second side of the lower portion of the pillar and formed parallel to the bit line.

14. The semiconductor device of claim 6, wherein the control bit line includes any one of titanium (Ti), titanium nitride (TiN), aluminum (Al), or an alloy thereof.

15. The semiconductor device of claim 6, wherein the control bit line comprises a stacked structure of polysilicon and metal.

16. The semiconductor device of claim 15, wherein the polysilicon is a p-type polysilicon.

* * * * *